United States Patent
Su et al.

(10) Patent No.: US 6,723,646 B2
(45) Date of Patent: Apr. 20, 2004

(54) METHOD FOR CONTROLLING AND MONITORING A CHEMICAL MECHANICAL POLISHING PROCESS

(75) Inventors: Chun-Lien Su, Tainan Hsien (TW); Chi-Yuan Chin, Taipei (TW); Shih-Keng Cho, Hsinchu (TW); Ming-Shang Chen, Hsinchu (TW); Yih-Shi Lin, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 61 days.

(21) Appl. No.: 10/054,962

(22) Filed: Jan. 25, 2002

(65) Prior Publication Data

US 2003/0143850 A1 Jul. 31, 2003

(51) Int. Cl.⁷ ............................................. H01L 21/302
(52) U.S. Cl. ........................................ 438/692; 438/693
(58) Field of Search .................................. 438/689, 690, 438/691, 692, 693

(56) References Cited

U.S. PATENT DOCUMENTS

| | | | | |
|---|---|---|---|---|
| 5,872,018 A | * | 2/1999 | Lee ............................... | 438/18 |
| 5,885,856 A | * | 3/1999 | Gilbert et al. ............... | 438/129 |
| 5,895,254 A | * | 4/1999 | Huang et al. ................ | 438/424 |
| 5,900,645 A | * | 5/1999 | Yamada ........................ | 257/48 |
| 6,093,631 A | * | 7/2000 | Jaso et al. ................... | 438/618 |
| 6,291,339 B1 | * | 9/2001 | Avanzino et al. ........... | 438/633 |
| 6,484,300 B1 | * | 11/2002 | Kim et al. ..................... | 716/7 |

* cited by examiner

Primary Examiner—Kin-Chan Chen

(57) ABSTRACT

The present invention relates a method of controlling and monitoring the thickness variation of the film structure of a semiconductor wafer by monitoring the thickness variation of the film structure of a testing region. The method is characterized by etching the film structure of the testing region with a pattern density substantially compatible with that of the device region in order to precisely simulate the thickness variation of the film structure of a device region in a chemical mechanical polishing process.

10 Claims, 6 Drawing Sheets

METHOD FOR CONTROLLING AND MONITORING A CHEMICAL MECHANICAL POLISHING PROCESS

FIELD OF THE INVENTION

The present invention generally relates to semiconductor process, and more specifically, to a planarizeation process

BACKGROUND OF THE INVENTION

With the progressing of semiconductor technology into the ULSI (Ultra Large Scale Integration) stage, the integrity of semiconductor devices has increased significantly. A single integrated circuits (IC) chip may includes millions or even billions of devices. The devices like transistors, capacitors and the elements like connections and isolations must be made much smaller for a densely packed IC chip. A great number of challenges like lithography, etching, and planarization process must be improved for fabricating integrated circuits with sub-micrometer or even smaller feature sizes.

In the front-end process of fabricating integrated circuits, an active area is defined. On a wafer, a plurality of active areas are made. Generally, there are some methods of defining active areas, including of surrounding each active area by forming a layer of field oxide, or surrounding each active area by forming some shallow trenches. So as the present manufacturing technology for IC, the method of defining active areas by forming oxide layers needs so many areas that the integrity of IC can not promote. As a result, the shallow trench isolation (STI) technique is now the most popular isolation technique.

The shallow trench isolation technique is about to form shallow trenches within the substrate first, and then to fill with oxide layer as a non-conducting material. A planarization step is performed to remove the oxide deposited on the top of the active areas to form shallow trenches with a planarized surface. A further description is set forth below with the accompanying drawings.

Referring now to FIG. 1, a pad oxide 110 is formed on the surface of a substrate 100, while a silicon nitride layer 120 is then deposited on the pad oxide 110, using a proper CVD method, such as plasma enhanced CVD, as a stop layer of a polishing or an etching process to avoid destroying the substrate 100. After the pad oxide 110 and the silicon nitride 120 are formed, use traditional lithographic and etching processes to form a patterned photoresist layer (not shown) thereon and then etch away the nitride layer 120 using the patterned PR. The remained nitride layer 120 is thus utilized as the mask for further etching the substrate 100 to generate a plurality of shallow trenches. The shallow trenches are the non-active areas, while the regions between the shallow trenches are the active areas. Specifically, due to different designs of ICs, the widths of the active and the non-active areas are different.

Referring to FIG. 2, a process of forming a liner oxide on the side wall and the bottom of shallow trenches by means of, for example, thermal oxidization method. Moreover, a layer of silicon oxide 130 is then formed on the shallow trenches of the non-active areas and on the nitride layer 120 of the active areas using high density plasma CVD (HDPCVD). HDPCVD method is to utilize reaction gases, including silane, oxygen and argon, etc., in the reaction chamber to generate inductively coupled plasma for higher density. However, the thickness of deposited films, according to the HDPCVD, is not regular over the surface. More specifically, the speed of films deposited on side walls is much slower than that on planar surfaces. If the widths of trenches are different, the thin films deposited by HDPCVD can fill narrower trenches more easier. Because of pattern of the bottom layer, the surface topography of the silicon oxide layer 130 is rough and uneven, concave on shallow trench regions, convex on the nitride layer 120.

After the silicon oxide layer 130 is deposited, the oxide layer 130 above the nitride layer 120 must be removed to get a planarized surface for subsequent processes. The promising technique for global planarization is chemical mechanical polishing (CMP) process or a mixed process of both CMP and etching processes. Although the CMP technique is an effective method for planarization, the time needed is hard to find out and control.

During the STI process described above, the time of the CMP process should be controlled precisely. However, according to the characteristic of the CMP process, the polishing speed is relevant to the bottom pattern, i.e., the larger area required for polishing, the smaller polishing speed it would be, and vice versa. That is the speed over the wafer surface is not equal. As a result, some regions on the wafer are over polished, while some are under polished.

Generally, the traditional technique for controlling the polishing time is to utilize an optical measurement apparatus to measure the thickness of a specific region, such as a process control and monitor key (PCM key), on the wafer surface, while a CMP process is performed, for determining the endpoint for material removal in a specific layer thickness. More specifically, the PCM key is one specific region, for monitoring, on the wafer surface, containing the same structure and thickness of films, but without any circuit pattern thereon. Accordingly, the PCM key's surface is planar and smooth, as illustrated in FIGS. 3A and 3B. FIG. 3A is the top view of the PCM key, while FIG. 3B is the cross-sectional diagram of the PCM key. However, an error is easily made as simulating the thickness variation of the films, on the wafer by monitoring the planar PCM key's topography surface of the device regions. This is because that the polishing speed on the PCM key is slower than that on the device regions. When an endpoint in the films of the PCM key has been detected, the films of the corresponding device regions are often over polished. The certain damages on the device regions will result in function degradation thereof.

Moreover, generally, the traditional CMP process should discover each proper polishing time for each wafer with different pattern by means of doing experiments. It is understood that the CMP process is such a product-dependant process. As a result, there is an essential need to precisely control and monitor the polishing speed and time in the CMP process to improve the planarization process of semiconductor wafers and further to enhance their yield and throughput.

SUMMARY OF THE INVENTION

It is an objective of this invention to provide a method of controlling and monitoring the thickness variation of the film structure of the semiconductor wafer.

It is another objective of this invention to provide a planarization process to precisely control the stop layer in the chemical mechanical polishing process.

According to objectives mentioned above, the invention discloses a method of planarization process of a semiconductor wafer by controlling and monitoring the thickness variation of the film structure of the testing region thereon.

The planarization method comprises the following processes. First, calculate a pattern density of the film structure of the device region. Etch the film structure of the testing region with a pattern density of the film structure of the testing region substantially compatible with that of the device region. Finally, polish the semiconductor wafer and monitor the thickness variation of the film structure of the testing region in order to precisely control the speed or time of polishing the whole wafer and to make sure the polishing process ended on the stop layer of the device region.

BRIEF DESCRIPTION OF THE DRAWINGS

For a more complete understanding of the invention, references are made to the following Detailed Description of the Preferred Embodiment taken in connection with the accompanying drawings in which.

DETAILED DESCRIPTION OF THE PREFERRED EMBODIMENT

The present invention discloses a method of controlling and monitoring the thickness variation of a film structure of a semiconductor wafer. The invention can overcome the traditional problem of stop layer control in a CMP process by patterning a specific testing region, on the wafer, for precisely simulating characteristics of one of device regions' topography. Therefore, the film structure of the device regions can be protected well without damages so the original design function thereof can be obtained.

As described in the background, the present invention also utilize an optical measurement apparatus to measure the thickness of a specific testing region, such as a process control and monitor key (PCM key), on the wafer surface, while a CMP process is performed, for determining the endpoint for material removal in a specific layer thickness. In one embodiment of the present invention, the PCM key is one specific region on the wafer, such as an area that its length is about 360 $\mu$m and its width is about 120 $\mu$m, near the area of a device region. It should be noted that the area of the testing region is not limited to the embodiment.

Without limiting the spirit and scope of the present invention, the above-described shallow trench isolation process will be applied to the embodiment of the present invention.

Figure 1:
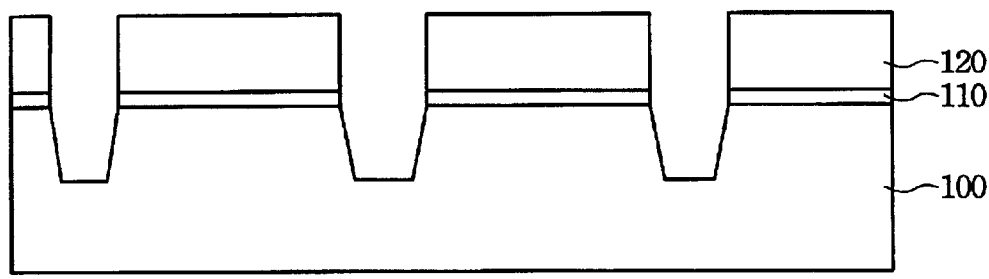
FIG. 1 schematically illustrates a cross-section of forming shallow trench isolations within a semiconductor substrate in a traditional process.
Figure 2:
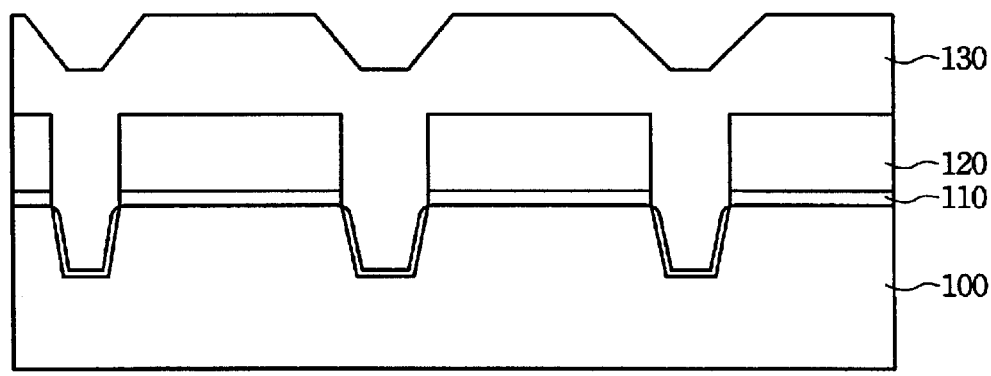
FIG. 2 schematically illustrates a cross-section view of forming a liner layer and a dielectric layer on the shallow trench isolation within a semiconductor substrate in a traditional process.
Figure 3A:
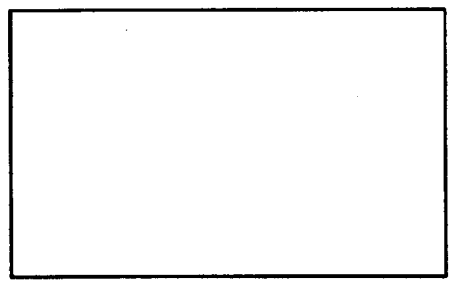
FIG. 3A schematically illustrates a top view of a testing region.
Figure 3B:
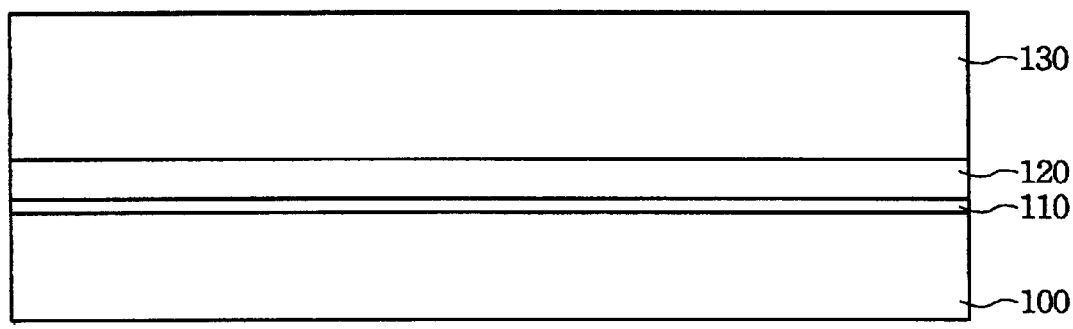
FIG. 3B schematically illustrates a cross-section view of a testing region.
Figure 4:
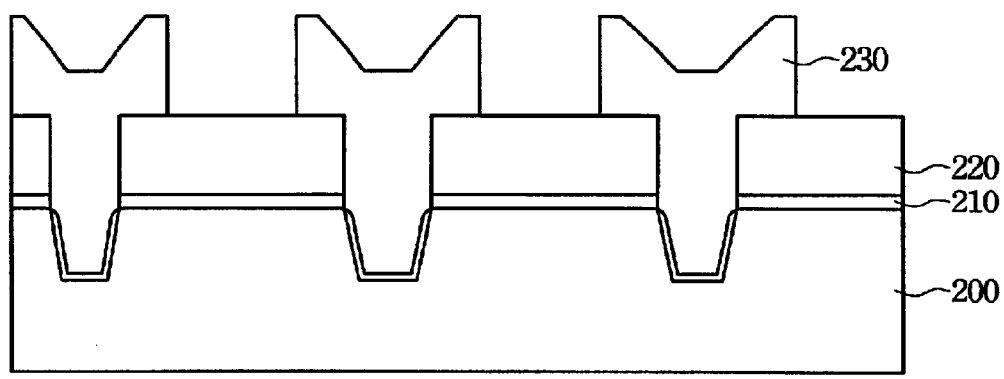
FIG. 4 schematically illustrates a cross-section view of a device region which the averaging process is performed.

As shown in FIG. 4, the surface, on a semiconductor substrate 200, comprises a pad oxide layer 210 and a silicon nitride layer 220 formed on the pad oxide layer 210, wherein the silicon nitride layer 220 is utilized as a stop layer in the CMP process of the present invention. In addition, after the pad oxide 210 and the silicon nitride layer 220 are formed, a plurality of shallow trench isolations are generated within the semiconductor substrate 200. According to the different designs of integrated circuits, the sizes of the active areas among the STI are not the same, i.e., some are larger, the others are smaller. As a dielectric layer 230 is deposited subsequently, for example, an oxide layer is formed using a high density plasma chemical vapor deposition (HDPCVD) method, both inside the STI regions and on the nitride layer 220 of the active areas, the dielectric layer 230 is uneven in surface according to the topography of the bottom pattern. The area sizes of the dielectric layer 230 above the STI regions are not equal as well.

According to the characteristic of the CMP process, as above mentioned, as polishing the dielectric layer 230, the larger polishing area it is, the smaller polishing speed it would be, and vice versa. The present invention thus improve the disadvantage of irregular polishing speed on the wafer surface by lithographing and etching the dielectric layer 230 to obtain dielectric blocks, with substantially the same size, before the CMP process is preformed. That is to average the dielectric blocks.

More specifically, in the averaging process, a mask is utilized to define a pattern on the silicon oxide layer 230. Thus, the silicon oxide layer 230 above the silicon nitride layer 220 is removed away, while the partial surface of the silicon nitride layer 220 is shown and the remained silicon oxide blocks are substantially with the same size. The advantage of the lithograph and etch process is that the condition of partially being over polished and partially being under polished, due to the irregular polishing speed on the wafer surface, will be improved because the remained silicon oxide blocks are substantially the same. As a result, the global planarization of the wafer surface can be controlled well and precisely.

However, if the averaging process is only performed on the polishing blocks on the device regions but not together with the corresponding PCM key, maintaining the original planar film structure, the difference of the film pattern characteristics between the device region and the testing region would be enlarged. In the subsequent CMP process, the phenomenon of failing to simulate the film thickness variation of the device region, by monitoring that of the testing region, will be further worsened. More specifically, because the difference of the film pattern characteristics between the device region and the testing region would be increased up to 100 times or more, device areas will be more easily over polished than without the dielectric block averaging process.

Figure 5:
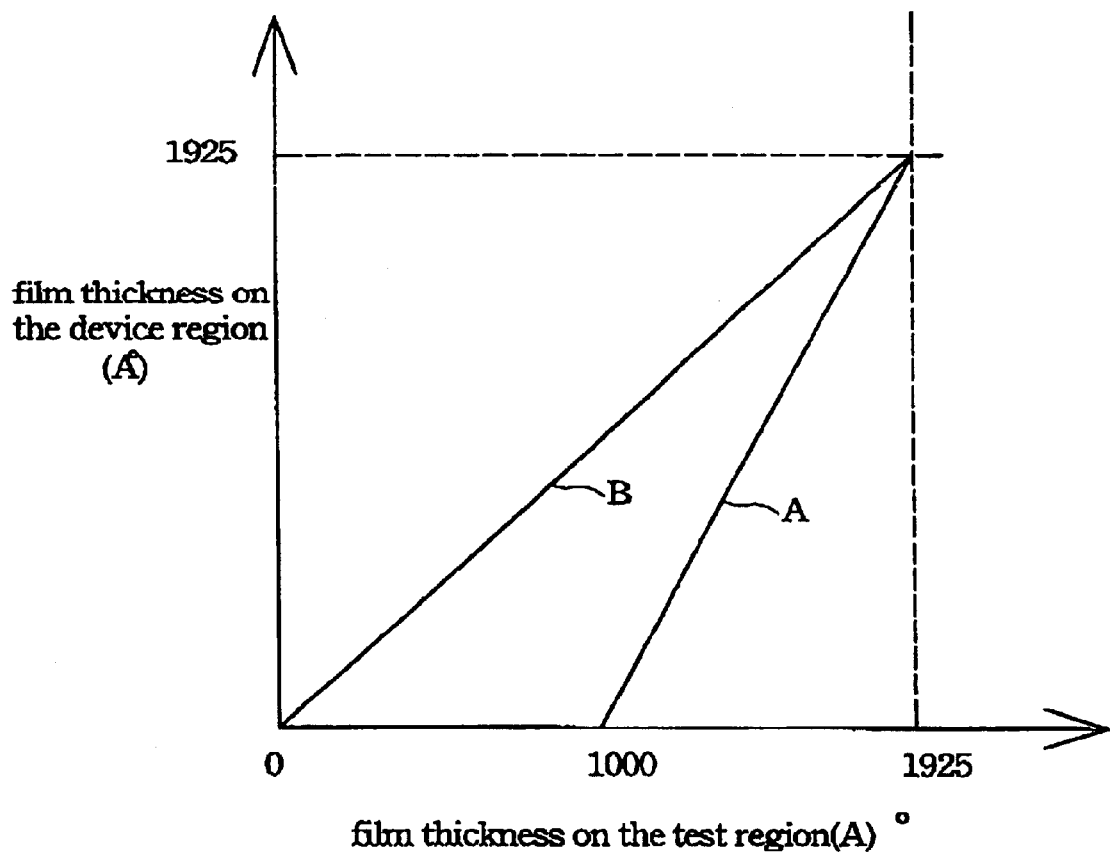
FIG. 5 schematically illustrates a process window relationship about the film thickness of both the device region and the testing region.

For example, if the thickness of the silicon oxide layer 230, on the device region and the testing region, is about 1925 Å, the process window for monitoring the testing region in the polishing process will be limited in the range about 1925 Å~1000 Å in order to prevent the device region to be over polished. That is, when the thickness of the silicon oxide layer 230 on the testing region is polished to about 1000 Å, the silicon oxide layer 230 on the device region has been totally polished and the CMP process stop on the surface of the nitride layer 220. As shown in FIG. 5, the line A schematically illustrates the process window relationship between the device region and the testing region, wherein the horizontal axis represents the thickness on the testing region for controlling and monitoring the thickness variation and the vertical axis represents the thickness, needed to be polished, on the device region. As the thickness value on the horizontal axis, i.e., the film thickness on the testing region, is about 1000 Å, the corresponding thickness value on the vertical axis, i.e., the film thickness on the device region, is about 0 Å.

Figure 6A:
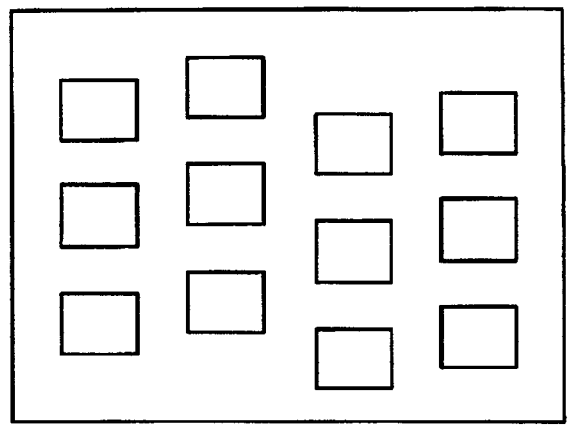
FIG. 6A schematically illustrates a top view of the film of the patterned testing region.
Figure 6B:
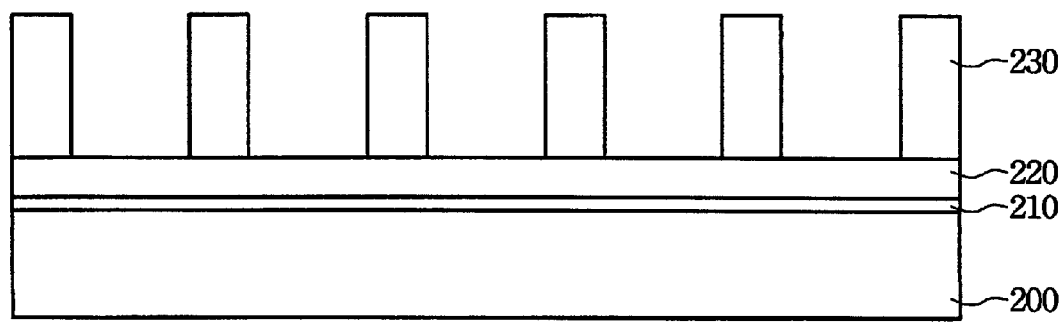
FIG. 6B schematically illustrates a cross-section view of the film of the patterned testing region.
Figure 7:
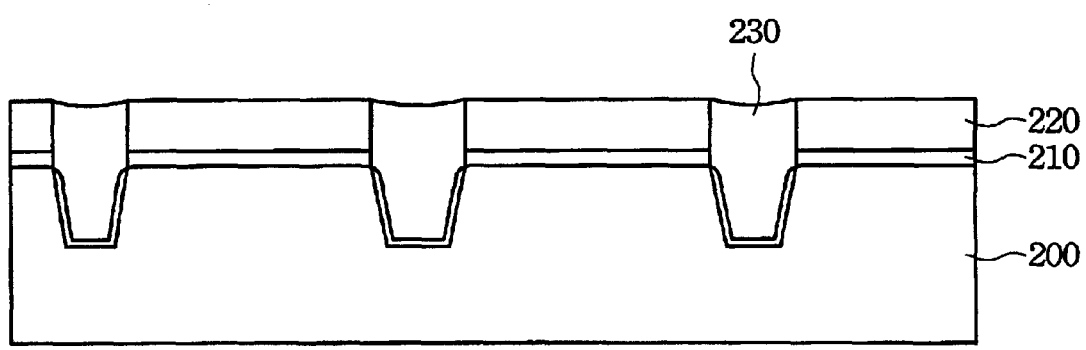
FIG. 7 schematically illustrates the whole dielectric layer on the device region is removed.

One of the distinguishing features of the present invention is to modify the traditional testing area, with a planar surface, on the wafer. The present invention discloses a method of patterning the film structure of the testing region, the PCM key, that the pattern density of the testing region is substantially compatible with that of the device region. In one embodiment of the present invention, when the averaging process is performed on the dielectric film of the device region, on the other hand, the same lithograph and etch process is also simultaneously performed on the testing region. As a result, the film patterns on both the device region and the testing region are substantially compatible with each other, or even exactly the same. As shown in FIG. 6A, it schematically illustrates the top view of the film pattern on the testing region after the lithograph and etch process is performed. FIG. 6B schematically illustrates the cross-section diagram of the film pattern on the testing region after the lithograph and etch process is performed. Therefore, the thickness variation of the film structure on the device region can be precisely simulated by controlling and monitoring the thickness variation of the film structure on the testing region and stop the polishing process on the stop layer, such as the silicon nitride layer 220. As shown in FIG. 7, as the thickness of the silicon oxide layer 230 on the testing region indicates 0 Å, the whole silicon oxide layer 230 on the device region is also removed. The process window of the above-mentioned polishing process can thus be expanded, for example, the process window may be expanded from 1920 Å to 0 Å. Accordingly, the line A of the process window on FIG. 5 accordingly shifts to the line B. It means that the safety judging range is also enlarged in the CMP process.

If the areas of both the device and testing regions are different or the film structure of the device region is more complicated so that the patterning process, performed on the device region, can not be directly performed on the testing region. The present invention further discloses a method of patterning the topography of the testing region to be substantially compatible with that of the device region. In another word, calculate the ratio D, the convex area $A_1$ on the device region to the total area $A_t$ on the device region ($D=A_1/A_t$), as a reference base. Then, pattern the testing region with reference to the ratio D that the pattern density of the testing region is accordingly substantially compatible with that of the device region. As indicated by experiments, controlling and monitoring the testing region, whose pattern density is less than 10 times that of the device region, can precise simulate the thickness variation of the device region. As a result, the traditional disadvantage of failing to simulate the device region can be improved.

Generally, there are many different pattern densities of integrated circuits on the wafer, the pattern density utilized to pattern the testing region depends on real cases. For example, the most representative pattern density can be chosen by considering which device region on the wafer is the most important. The present invention can precisely simulate the thickness variation of the device region by merely transferring the characteristics of the topography on the device region to the PCM key rather than finding out the polishing relationship between the device and the testing regions by repeated experiments. Accordingly, the present invention decreases the dependence of the CMP process to each IC products and increases the yield and the throughput as well.

Although the invention has been described in detail herein with reference to its preferred embodiment, it is to be understood that this description is by way of example only, and is not to be interpreted in a limiting sense. It is to be further understood that numerous changes in the details of the embodiments are included within the spirit and scope of the present invention. Additional embodiments of the invention will be apparent, and may be made by persons of ordinary skill in the art, having reference to this description. It is understood that such changes and additional embodiments are within the spirit and true scope of the invention as claimed below.

We claim:

1. A method of determining proper process time of chemical mechanical polishing, the method comprising:

forming a film on a wafer having at least one device region and at least one test region;

calculating a first pattern density of the device region to determine a second pattern density of the test region such that the second pattern density is substantially compatible with the first pattern density;

patterning the film on the wafer to form a first pattern, having the first pattern density, on the device region and a second pattern, having the second pattern density, on the test region to form dummy structures on the substrate; and polishing the film on the wafer by chemical mechanical polishing until a thickness of the film on the test region is zero.

2. The method of claim 1, wherein the second pattern density is less than 10 times of the first pattern density.

3. The method of claim 1, wherein the second pattern density is the same as the first pattern density.

4. A method of forming shallow trench isolation, the method comprising:

forming a first dielectric layer on a wafer having at least one device region and at least one test region;

etching the first dielectric layer and the wafer to form at least one trench on the device region;

forming a second dielectric layer on the wafer and in the trench to fill the trench;

calculating a first pattern density of the device region to determine a second pattern density of the test region such that the second pattern density is substantially compatible with the first pattern density;

etching the second dielectric layer on the wafer to form a first pattern, having the first pattern density, on the device region and a second pattern, having the second pattern density, on the test region until the first dielectric layer is exposed, and transforming the second dielectric layer to dummy structures on the substrate; and polishing the second dielectric layer on the wafer by chemical mechanical polishing until a thickness of the second dielectric layer on the test region is zero to form shallow trench isolation in the trench.

5. The method of claim 4, wherein the second pattern density is less than 10 times of the first pattern density.

6. The method of claim 4, wherein the second pattern density is the same as the first pattern density.

7. The method of claim 4, wherein the sizes of the dummy structures are about the same.

8. The method of claim 4, wherein the first pattern density on the device region is obtained by calculating a ratio of the area of the dummy structures to the total area of the device region.

9. The method of claim 4, wherein the first dielectric layer comprises a silicon nitride layer as a stop layer in the chemical mechanical polishing process.

10. The method of claim 4, wherein the second dielectric layer comprises a silicon oxide layer formed by high-density plasma CVD.

* * * * *